(12) United States Patent
Brenner

(10) Patent No.: US 7,528,632 B2
(45) Date of Patent: May 5, 2009

(54) HALF BIN LINEAR FREQUENCY DISCRIMINATOR

(75) Inventor: Joel Brenner, Arzo (CH)

(73) Assignee: NemeriX SA, Manno (CH)

( * ) Notice: Subject to any disclaimer, the term of this patent is extended or adjusted under 35 U.S.C. 154(b) by 184 days.

(21) Appl. No.: 11/343,754

(22) Filed: Jan. 31, 2006

(65) Prior Publication Data

US 2006/0226824 A1      Oct. 12, 2006

(30) Foreign Application Priority Data

Feb. 25, 2005    (EP)    ................... 05101463

(51) Int. Cl.
*G01R 23/02* (2006.01)
(52) U.S. Cl. .......................... 327/39; 327/46
(58) Field of Classification Search ........... None
See application file for complete search history.

(56) References Cited

U.S. PATENT DOCUMENTS 4,651,104 A * 3/1987 Miyo .......................... 327/47

5,291,081 A     3/1994 Takeuchi ...................... 327/47
6,847,255 B2 * 1/2005 Petrovic et al. ............. 329/323

FOREIGN PATENT DOCUMENTS

EP     0 788 225 A     6/1997
WO    WO0225829 A     3/2002

* cited by examiner

*Primary Examiner*—Cassandra Cox
(74) *Attorney, Agent, or Firm*—Pearne & Gordon LLP

(57) ABSTRACT

Frequency discriminator based on a variant of the DFT transform in which the usual twiddle factors are replaced with twiddle factors as for a DFT on a number of points which is the double as the actual number of sample points. The DFT so modified allows half-bin frequency discrimination, with few added computational burden. Two DFT shifted of half bin with respect to the zero frequency provide a linear response of the discrimination and good immunity to noise. The discriminator is particularly useful in FLL for tracking signals in a GPS receiver.

15 Claims, 6 Drawing Sheets

PRIOR ART

US 7,528,632 B2

HALF BIN LINEAR FREQUENCY DISCRIMINATOR

REFERENCE DATA

This application claims priority from European Patent application No 2005EP-101463 of Feb. 25, 2005, the contents whereof are hereby incorporated by reference.

FIELD OF THE INVENTION

The current invention relates to a method of estimating the frequency of a signal, and to the corresponding device. In particular, but not exclusively, the present invention relates to the application of the aforementioned method and device to the acquisition and tracking of localization signal like, for example, the signal emitted from one or more GPS (Global Positioning System) satellites, or the signal involved in another radio localization system.

DESCRIPTION OF RELATED ART

The frequency estimate, in particular the frequency estimate of sinusoidal signals, is an operation used in a large number of applications.

Functionally speaking, the term frequency discriminator is employed here to indicate an algorithm or a mathematical operation that, applied to a vector containing a sampled signal, is able to estimate the fundamental frequency of the signal itself. Similarly, the term frequency discriminator may also indicate, in the contest of this invention, a portion of software for determining the frequency of a signal represented for example by a series of time samples. The term frequency discriminator also designates in the following, when referred to a device, an element of electronic circuitry arranged or programmed in a manner as to estimate the fundamental frequency of an analogue or digital signal present to its input.

An example of utilization of a frequency discriminator is the FLL (Frequency Locked Loop) represented schematically in FIG. 1. In this example an incoming signal 42 is combined 45 with the signal of a local oscillator 44 in a mixer 45. The resulting difference frequency is applied to a frequency discriminator 47. The result of the frequency discriminator is in principle proportional to the fundamental frequency of the input, and is used to drive the local oscillator in a feedback loop comprising the filter 49 so that it is tuned at the same frequency as the received signal.

An important application of frequency discriminator is in the Carrier tracking loop of GPS receivers. The operation of GPS receivers usually comprises an acquisition mode, in which the signal received from the Space Vehicles (SV) are searched, and a tracking mode, in which the acquired signals are followed both in carrier frequency or phase and in code phase.

The frequency of the signal received from SV in a GPS system is in principle affected by a number of instrumental errors, for example frequency bias and drift of the local oscillators, as well as by a physical Doppler shift, related to the relative speed between the SV and the receiver, which must be appropriately measured, in order to maintain tracking of the SV and arrive at a position determination. This is commonly realized, in GPS receivers, by means of PLL and FLL feedback loops.

Typically, the FLL loop is used during the acquisition phase, in reason of its superior noise immunity. The PLL provides better tracking performances when the signal strength is adequate. A FLL fallback mode is often provided, as a substitute of the PLL, for tracking weak signals, and during dynamic peaks due to the motion of the receiver.

In a large number of applications the frequency estimation is done by applying the frequency mathematical definition of the frequency as the time-derivative of the phase, $f=\dot{\varphi}$. The incremental ratio of the phase is then taken as an estimator of the frequency.

$$f(x, t_n) = \frac{\varphi(x, t_n) - \varphi(x, t_{n-1})}{\Delta t_{n;n-1}} \quad (1)$$

This approach, however, is not practically available when noise exceed a certain threshold, in which case the phase signal is not clearly detectable Another possible method implies the extraction of one or more DFT (Discrete Fourier Transform) of the input signal. Frequency discriminators based on such methods are however affected by nonlinearities or instabilities, particularly in the neighbourhood of the zero frequency, as it will be explained in more detail later.

It is therefore an aim of the present invention to provide a frequency discriminator free from the shortcomings of known methods and devices of this type.

It is a further object of the present invention to provide a frequency discriminator exhibiting a linear response in its operating range.

It is another object of the present invention to provide a frequency discriminator having a good immunity to noise.

BRIEF SUMMARY OF THE INVENTION

The above objects are attained by a frequency discriminator method having the feature of the attached independent method claim, and by the corresponding device and software. Further optional features are the object of dependent claims.

BRIEF DESCRIPTION OF THE DRAWINGS

The invention will be better understood by the examples set out in the description and illustrated by the drawings, in which.

DETAILED DESCRIPTION OF THE INVENTION

It is known to use Discrete Fourier Transform (DFT) to realize a frequency discriminator on digital signals. Conceptually, this class of discriminators is based on the principle of comparing the output of at least two distinct DFT operations, centred at different frequencies.

The DFT is a discrete estimation of a single spectral component of an input signal, equivalent to one single element of a Fourier transform.

More precisely, if $\{x_i\}$ is a discrete sequence of complex values, corresponding to N samples of a complex signal, the channel-k DFT of $\{x_i\}$ is defined by $$DFT(x, k) = \sum_{i=0}^{N-1} x_i \cdot \left( \sin\left(\frac{2\pi \cdot k \cdot i}{N}\right) + j \cdot \cos\left(\frac{2\pi \cdot k \cdot i}{N}\right) \right) - N \leq k < N \quad (2)$$

or, in compact form $$DFT(x, k) = \sum_{i=0}^{N-1} x_i W_N^{k,i} \quad (3)$$

where $$W_N^{k,i} = e^{-j\frac{2\pi \cdot k \cdot i}{N}} \quad (4)$$

The DFT can therefore be regarded as a linear combination of the samples $x_i$ in which the weights W, also indicated as "Twiddle factors", are the N distinct roots of order N of unity in the complex field, taken in increments of k.

Figure 2:
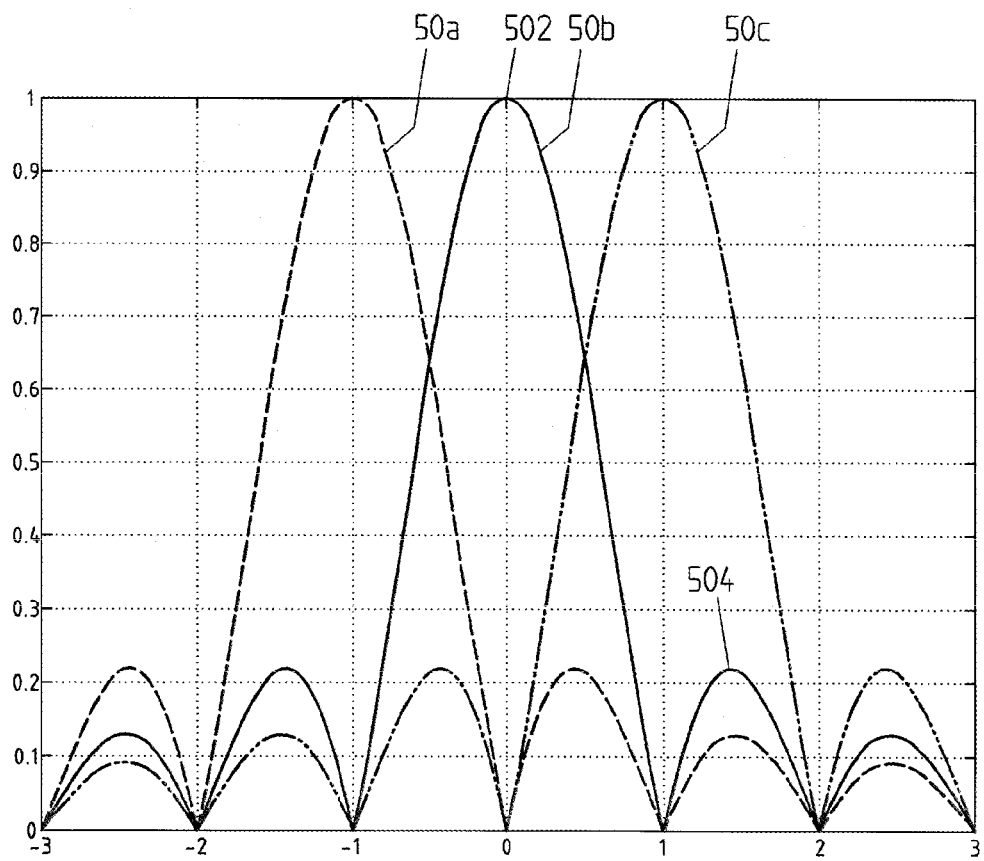
FIG. 2 represents the absolute value of the transfer function of three DFT operations centred on three adjacent frequency bins.

Referring now to FIG. 2, it is possible to appreciate the frequency response of three distinct DFT operators 50a, 50b and 50c, centred on three consecutive frequency bins corresponding to k=−1, k=0, and k=1, respectively. Analytically, in the case where the samples are equally spaced, and indicating the sampling period with T, the amplitude response curve of each DFT is given by.

$$R_k(f) = N \cdot \left| \frac{\sin\left(2 \cdot \pi \cdot \left(f \cdot T - \frac{k}{N}\right)\right)}{2 \cdot \pi \cdot \left(f \cdot T - \frac{k}{N}\right)} \right| = N \cdot \left| \mathrm{sinc}\left(f \cdot T - \frac{k}{N}\right) \right| \quad (5)$$

with $-\frac{N}{2} < k < \frac{N}{2}$

The response of each DFT has thus a central peak 502 at f=k/NT, and secondary maxima 504. The response of the DFT operator is strictly zero for any frequency multiple of the DFT bin width 1/NT, apart the central peak frequency.

The extraction of the absolute value is used to extract the real non-negative amplitude value of the complex DFT output.

A possible manner of building a DFT frequency estimator involves the evaluation of the quantity $$f_x = \frac{DFT_D(x) - DFT_U(x)}{DFT_D(x) + DFT_U(x)} \quad (6)$$

where $DFT_D$ and $DFT_U$ stand for the operators |DFT(x,−1)| and |DFT(x,+1)| that is to say, the DFT corresponding to curves 50a and 50c of FIG. 2.

In the discriminator of equation (6), the frequency is estimated by means of the amplitude difference between the two DFT having k=+1 and k=−1. The difference is then normalized using the sum of the two DFT amplitudes.

Figure 3:
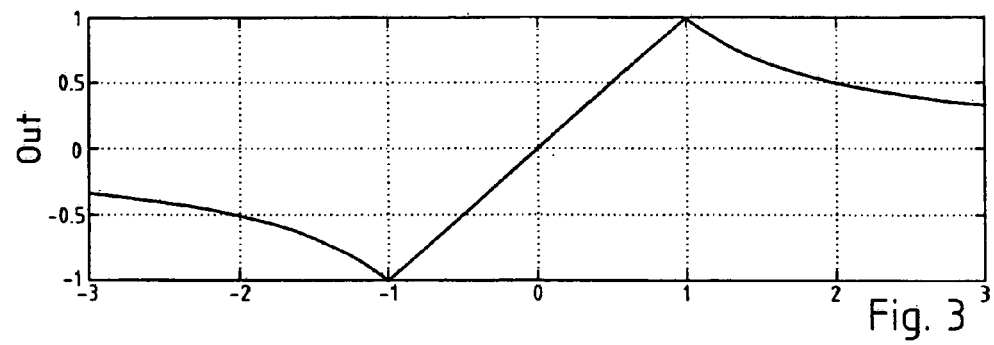
FIG. 3 shows the response of a frequency discriminator based on two of the DFT of FIG. 2, in ideal noiseless conditions.
Figure 4:
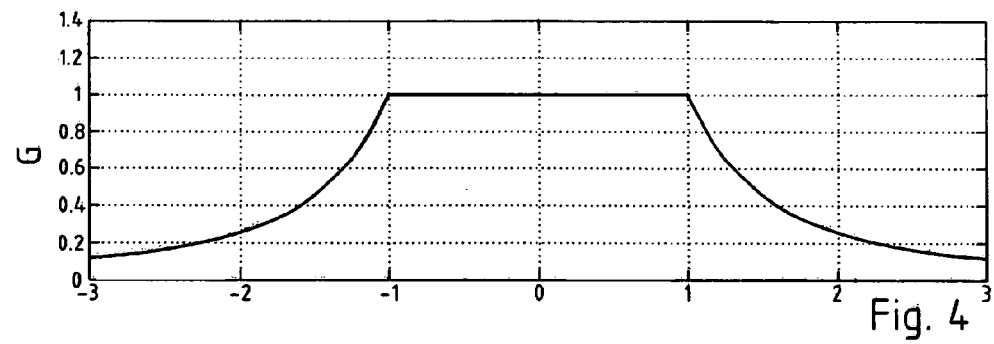
FIG. 4 shows the gain of the discriminator of FIG. 3.

FIGS. 3 and 4 show the theoretical response of the discriminator of equation (6), and the relative gain. An advantage of this discriminator is that the response is strictly linear, i.e the gain is constant, in the frequency range from f=−1/(NT) to f=1/(NT).

Figure 5:
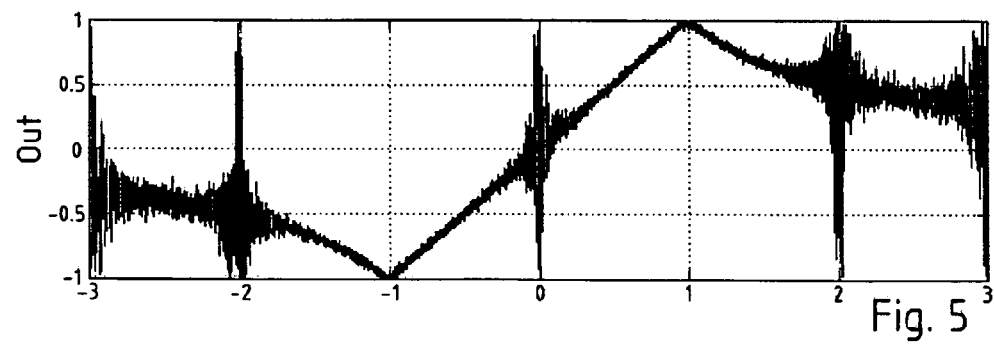
FIG. 5 shows the behaviour of the discriminator of FIG. 3 in presence of normal distributed noise.

A strong limitation of this approach is however that, in the frequency region close to f=0, both DFT are tending to zero, making the difference noise dominated. This problem is amplified by the fact that the normalization factor also tends to zero, due to the shape of the response $R_x$. The result is therefore mathematically undetermined in the vicinity of f=0. FIG. 5 shows the same response as FIG. 3, but with the addition of simulated random noise in the input signal. It is apparent that this discriminator provides essentially random result for frequencies close to f=0.

The discriminator of equation (6) has therefore a point of instability in the middle of its frequency range and is therefore useless in most practical applications. A way to obviate to this problem is to add the DFT 50c corresponding to k=0 in the normalization factor thus:

$$f_x = \frac{DFT_D(x) - DFT_U(x)}{DFT_D(x) + DFT_0(x) + DFT_U(x)} \quad (7)$$

Figure 6:
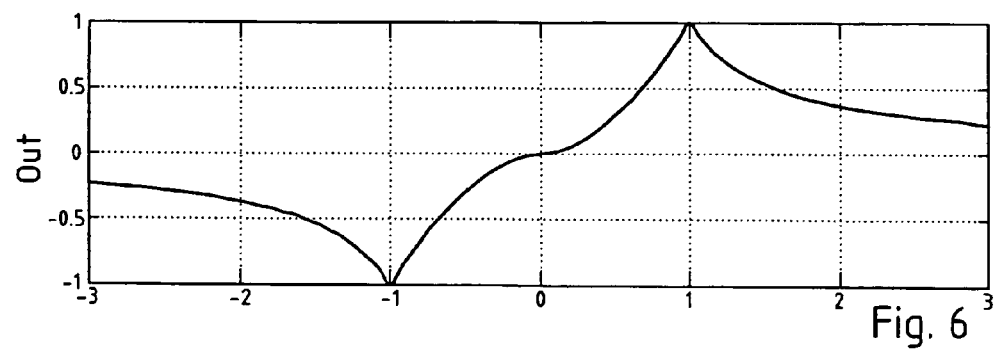
FIG. 6 shows the response of a frequency discriminator based on the three DFT of FIG. 2, in ideal noiseless conditions.
Figure 7:
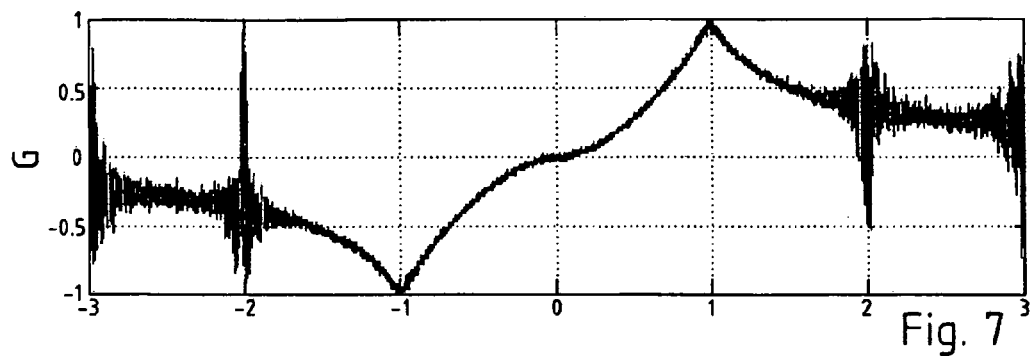
FIG. 7 shows the behaviour of the frequency discriminator of FIG. 6, in presence of normal distributed noise.

The response of discriminator of equation (7) is shown in FIG. 6 and, with the addition of simulated noise, in FIG. 7. Noise immunity is now satisfactory, however the discriminator has essentially no gain for frequencies very close to f=0. In some application this fact can be penalizing, in particular it will induce a hysteresis in the FFL loop of FIG. 1.

According to the present invention, the frequency discriminator comprises the evaluation of two Half-bin Discrete Fourier Transform (HDFT) at different frequencies, wherein the half-bin DFT are defined by formula (3) above, in which the index k takes a half/integer value.

In particular:

$$HDFT(x, -1/2) = \sum_{i=0}^{N-1} x_i \cdot W_N^{-i/2} \quad (8)$$

$$HDFT(x, -1/2) = \sum_{i=0}^{N-1} x_i \cdot W_N^{i/2}$$

However, examination of the expression defining the twiddle factors W reveals that $$W_N^{\frac{k}{2} \cdot i} = W_{2 \cdot N}^{k \cdot i} \quad (9)$$

The HDFT is thus calculated in the same manner as the ordinary DFT, but the twiddle factors W are taken as if the order of the Fourier transform was 2N, instead of N.

The frequency response of the HDFT (in absolute value) is still given by equation (5).

More precisely we define:

$$H_U(x) = \sum_{i=0}^{N-1} x_i \cdot e^{-j\frac{2\pi \cdot i}{2N}} \quad (10)$$

$$H_D(x) = \sum_{i=0}^{N-1} x_i \cdot e^{j\frac{2\pi \cdot i}{2N}}$$

or $$H_U(x) = \sum_{i=0}^{N-1} x_i \cdot W_{2N}^{i}$$

$$H_D(x) = \sum_{i=0}^{N-1} x_i \cdot W_{2N}^{-i}$$

The formulation of the frequency discriminator becomes then:

$$f(x) \cong \frac{|H_D(x)| - |H_U(x)|}{|H_D(x)| + |H_U(x)|} \quad (11)$$

However, the peak frequencies are centred on half-integer values of the DFT bin width 1/NT.

The frequency extraction operators $H_D$ and $H_U$ involve the linear combination of the samples $x_i$ with weights, or twiddle factors, which are N complex roots of unity from the 2N distinct roots of unity of order 2N.

Figure 8:
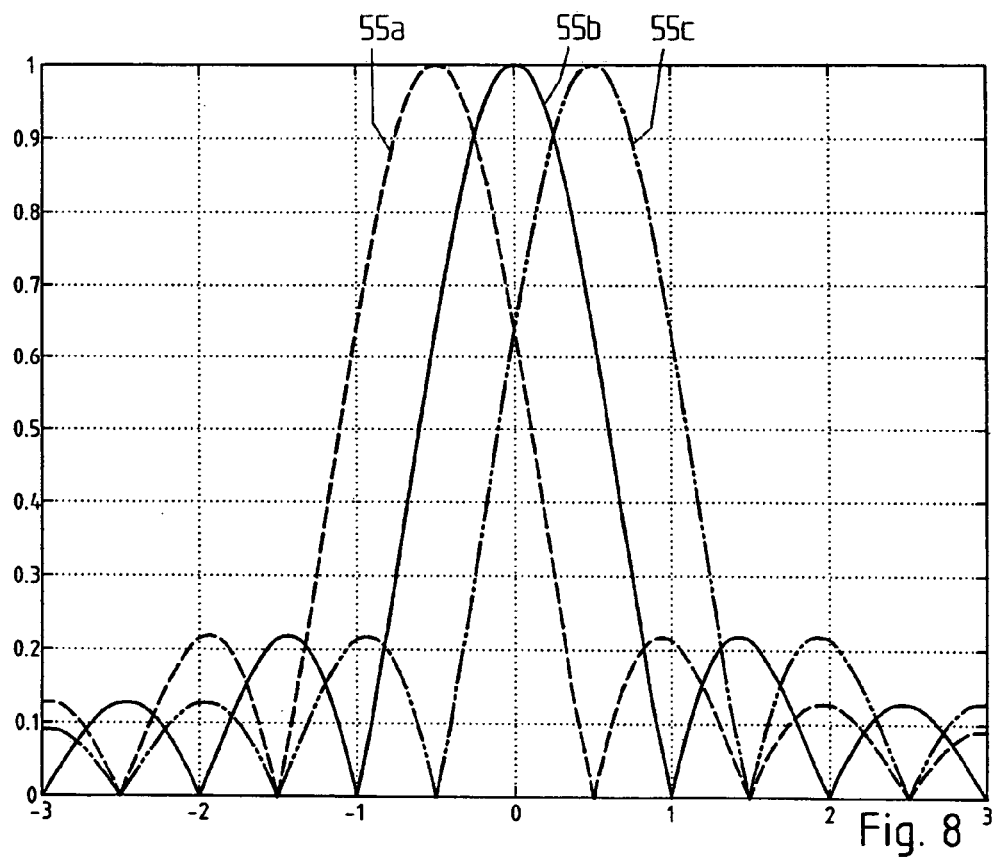
FIG. 8 shows the absolute value of the of three DFT operations shifted of half frequency bin.

FIG. 8 shows for example the response HDFT 55a corresponding to k=−½ and 55c, corresponding to k=½. Curve 55b, corresponding to k=0 is identical to curve 50b of FIG. 2.

Figure 1:
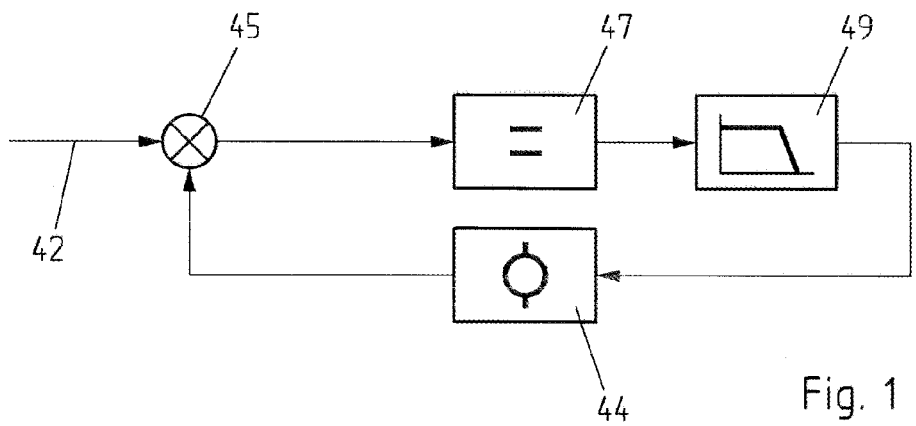
FIG. 1 diagrammatically shows a known FLL including a frequency discriminator.
Figure 9:
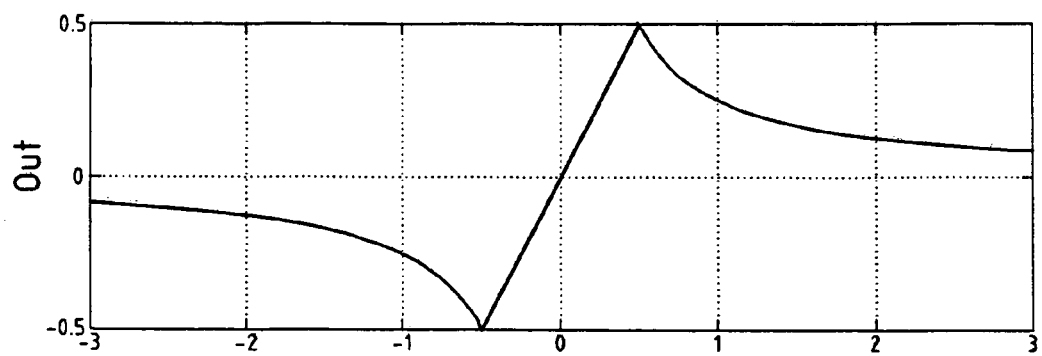
FIG. 9 shows the response of a frequency discriminator based on the two extreme DFT of FIG. 8.
Figure 10:
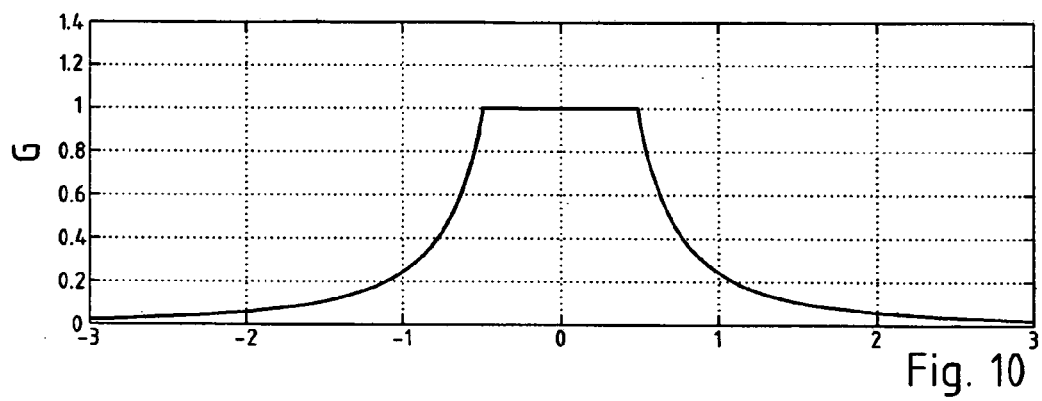
FIG. 10 shows the gain of the discriminator of FIG. 8.

It will be appreciated that, in contrast with DFT curves of FIG. 1, the curves 55a and 55c do not go to zero simultaneously for f=0. This allows the construction of a half-bin frequency discriminator with the response and the gain shown in FIGS. 9 and 10.

Figure 11:
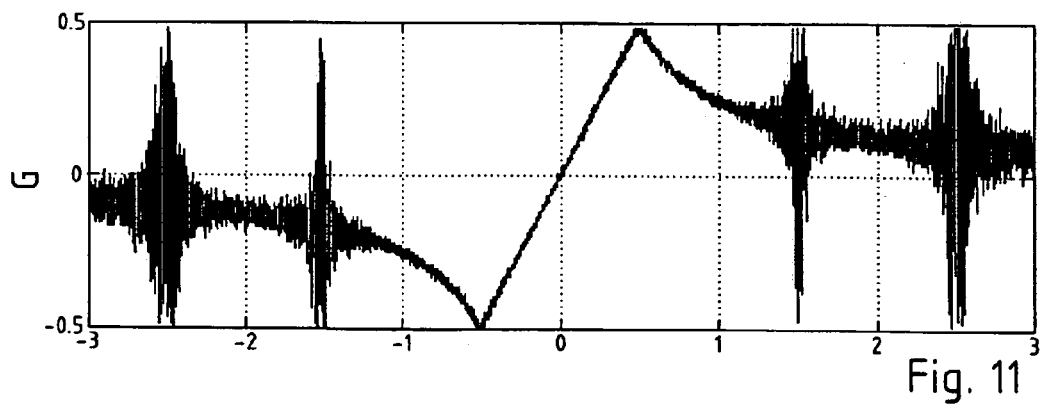
FIG. 11 shows the behaviour of the frequency discriminator of FIG. 8, in presence of normal distributed noise.

Advantageously, the half-bin discriminator of the invention exhibits a linear response along all the operating range going from $f_D$=−1/2NT to $f_U$=½NT and is stable in the entirety of his operating range, since the denominator of equation (11) is not tending to zero for f=0. FIG. 11 shows the behaviour of the half-bin discriminator of the invention, in presence of normal distributed noise The mathematical formulation of the "Half Bin DFT" can also be deduced from a particular characteristic of the FFT algorithm. A complex FFT takes a vector of N samples of a signal and calculates N spectral lines at j/NT for 0≦i<N. Sometimes, in order to artificially enhance the resolution of the calculated spectra, an FFT of 2N points is calculated adding N zeros at the end of the input sample vector. This operation, generates N new spectral lines placed at (2i+1)/2NT for 0≦i<N placed exactly in the middle of two N FFT frequency bins. Considering that the FFT algorithm is nothing more than an optimization and a reorganization of a bank of N DFTs we can deduce the formulation of the half bin DFT by replacing the spectral lines 1 and 2N−1 (negative frequency) of a 2N points FFT with his equivalent DFT. The 2N point DFT for k=1 and k=2N−1 becomes:

$$DFT(x, k = 1; 2N - 1) = \sum_{i=0}^{2N-1} x_i \cdot e^{-j\frac{2\pi \cdot k \cdot i}{2N}} \quad \frac{N}{2} < k < \frac{N}{2} \quad (12)$$

$$DFT(x, k = 1; 2N - 1) = \sum_{i=0}^{2N-1} x_i \cdot W_{2N}^{k \cdot i}$$

but considering that the last N points of the input vector are zeros:

$$DFT(x, k = 1; 2N - 1) = \sum_{i=0}^{N-1} x_i \cdot e^{-j\frac{2\pi \cdot k \cdot i}{2N}} \quad -\frac{N}{2} < k < \frac{N}{2} \quad (13)$$

$$DFT(x, k = 1; 2N - 1) = \sum_{i=0}^{N-1} x_i \cdot W_{2N}^{k \cdot i}$$

This last formulation is exactly the same as the formulation of the half bin DFT previously deduced.

The frequency discriminator of the invention thus comprises the steps of calculating at least two discrete spectral components of an incoming signal, preferably two spectral components corresponding to two frequencies $f_D$ and $f_U$, symmetrically placed above and under the zero frequency.

Each spectral component is extracted by an operator $H_D$ or $H_U$, which has a maximum of its response for the desired spectral component $f_D$ and $f_U$. The response naturally decreases for different frequencies, but in a manner that the response does not go to zero for any intermediate frequency between $f_D$ and $f_U$. In particular the response of $H_D$ and $H_U$ do not go to zero at the intermediate point f=0.

Thanks to this feature, the discriminator of the invention can extract a frequency error signal, obtained by a step of calculating the difference of the absolute-value outputs of $H_D$ and $H_U$, divided by the sum of the absolute-value outputs of $H_D$ and $H_U$.

Since neither the sum nor the difference of the absolute-value outputs of $H_D$ and $H_U$ is allowed to go to zero in any point of the range between $f_D$ and $f_U$, the discriminator so obtained is well-behaved, even considering the inevitable influence of noise, ant its value is linear between $f_D$ and $f_U$.

By using the HDFT operator described above, the frequencies $f_D$ and $f_U$ of $H_D$ and $H_U$ are $f_D$=−½NT to $f_U$=½NT, that is they are centred on half-integer values with respect to the natural binning of the sequence of the N incoming digital data $\{x_i\}$, which are sampled at a T sampling rate.

In a preferred embodiment, the operators $H_D$ and $H_U$ have the form set out in equation (11) above. However, the operators $H_D$ and $H_U$ may also be obtained, according to the present invention, from different mathematical operators, for extracting a frequency component of the incoming signal, as the circumstances may require.

Figure 12:
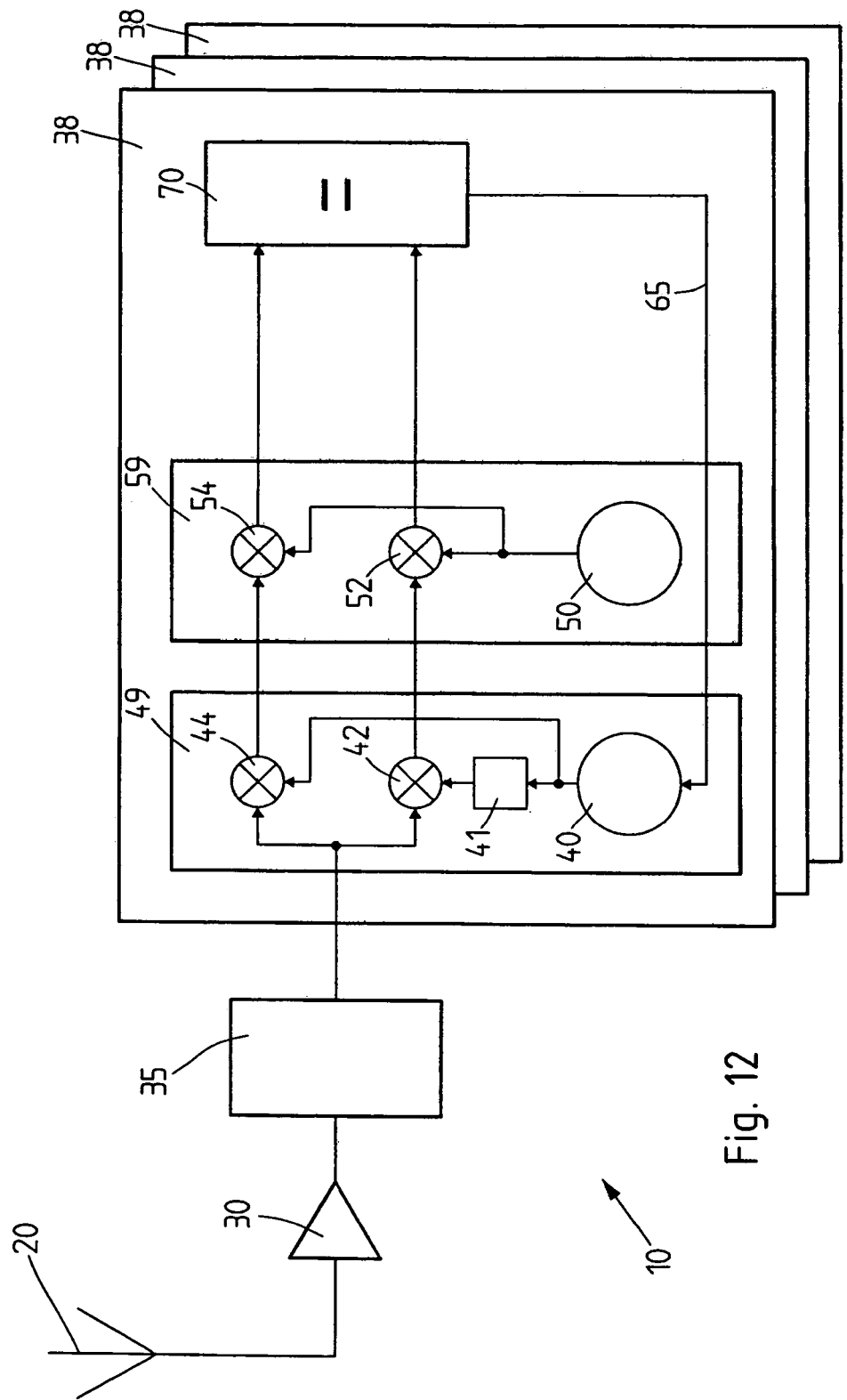
FIG. 12 schematically shows a receiving and tracking module of a GPS receiver according to an aspect of the present invention.

The present invention also comprises a receiver for a radio positioning system, in particular a GPS receiver, described now with reference to FIG. 12.

The receiver comprises a receiving antenna 20, adapted to the specific radio signal of the sources in the radio localization system. In a GPS system the sources are the orbiting GPS Space Vehicles, emitting a radio-localization signal at 1575.42 MHz. The signal received by the antenna is amplified by the low-noise amplifier 30 and down-converted to an intermediate frequency signal (IF signal) in the conversion unit 35, before being fed to the carrier removal stage 49. Other methods of processing the RF signal, including for example Analogue-to-Digital Conversion, are conventionally known and comprised in the present invention.

The IF signal is then fed, among others, to a correlation processor, whose function is to de-spread the signals received from each SV, and to align them temporally with locally generated copies of the pseudorandom ranging codes specific for each SV, for example, in case of a GPS receiver, the correlation processor has the task of demodulating and tracking the coarse acquisition (C/A) GPS ranging signals. To perform such alignment, the correlators processor comprises an array of tracking modules 38, each of which is dedicated, for example to the acquisition and the tracking of a specific SV.

The various functions of the tracking modules 38 are described in the following with reference to the FIG. 12. It is to be understood, however, that this description is given by way of example only, and should not be interpreted as a limitation of the present invention. In particular the various elements and modules described must be understood in functional terms, and do not necessarily correspond to physical circuit elements. In particular several functions may be carried out by software modules, executed by one or more digital processors.

Also, even if the various tracking modules 38 are here described as totally independent and parallel, for the sake of clarity, it must be understood, however, that some features or resources can be shared among tracking modules, as the circumstances require.

Each tracking module has a carrier removal stage 49 comprising, conventionally, a local NCO 40, for generating a local oscillator signal, and a 90° phase shifter 41, producing a quadrature replica of the local oscillator signal. In a possible variant, the 90° phase shift may be done in a external front-end circuit. The incoming radio signal is multiplied with the in-phase and with the quadrature local oscillator signal in the multipliers 44, respectively 42, to produce a baseband in-phase signal and a baseband quadrature signal. In tracking mode, the frequency or phase of the NCO 40 is locked to the carrier frequency or phase of the tracked SV.

Each tracking module 38 comprises also a local Gold pseudorandom code generator 50, for generating a local replica of the C/A code corresponding to a particular GPS Space Vehicle. The Gold pseudorandom codes can be generated internally, for example by a tapped shift register, or, equivalently, extracted from a preloaded table or by any other technique.

The Gold code generator 50 comprises an independent numerically controlled C/A clock whose frequency is set to produce a C/A code at a chipping rate of 1.023 MHz. The incoming IF signal is multiplied by the in-phase (I) and quadrature (Q) components of the local carrier and by the local C/A code. During tracking the local C/A code need to be time-locked to the C/A code received from the SV. The local carrier frequency and phase need to be locked to the frequency and phase of the carrier of the received signal, to compensate for Doppler shift on the SV signal and local oscillator frequency drift and bias.

The correlation data for the in-phase signal and for the quadrature signal can be regarded as the real and imaginary part of a complex signal. In an ideal frequency lock condition, the frequency of the NCO 40 and the frequency of the carrier are identical, and the signal present at the input of the discriminator 70 is a pure baseband signal, whose fundamental frequency is zero. During tracking the discriminator module 70 produces a frequency error signal 65 which is used for driving the NCO 40 of the carrier removal stage in a feedback loop, in order to lock to the frequency of the received signal.

Frequency control device, comprising a variable frequency source (44), a mixer (45) for combining an input frequency (42) with an output of the variable frequency source (44), a discriminator according to one of claims 9 to 11 comparing an output signal of the mixer and generating a frequency error signal, for driving the variable frequency source (44) and locking it to the input frequency (42).

Figure 13:
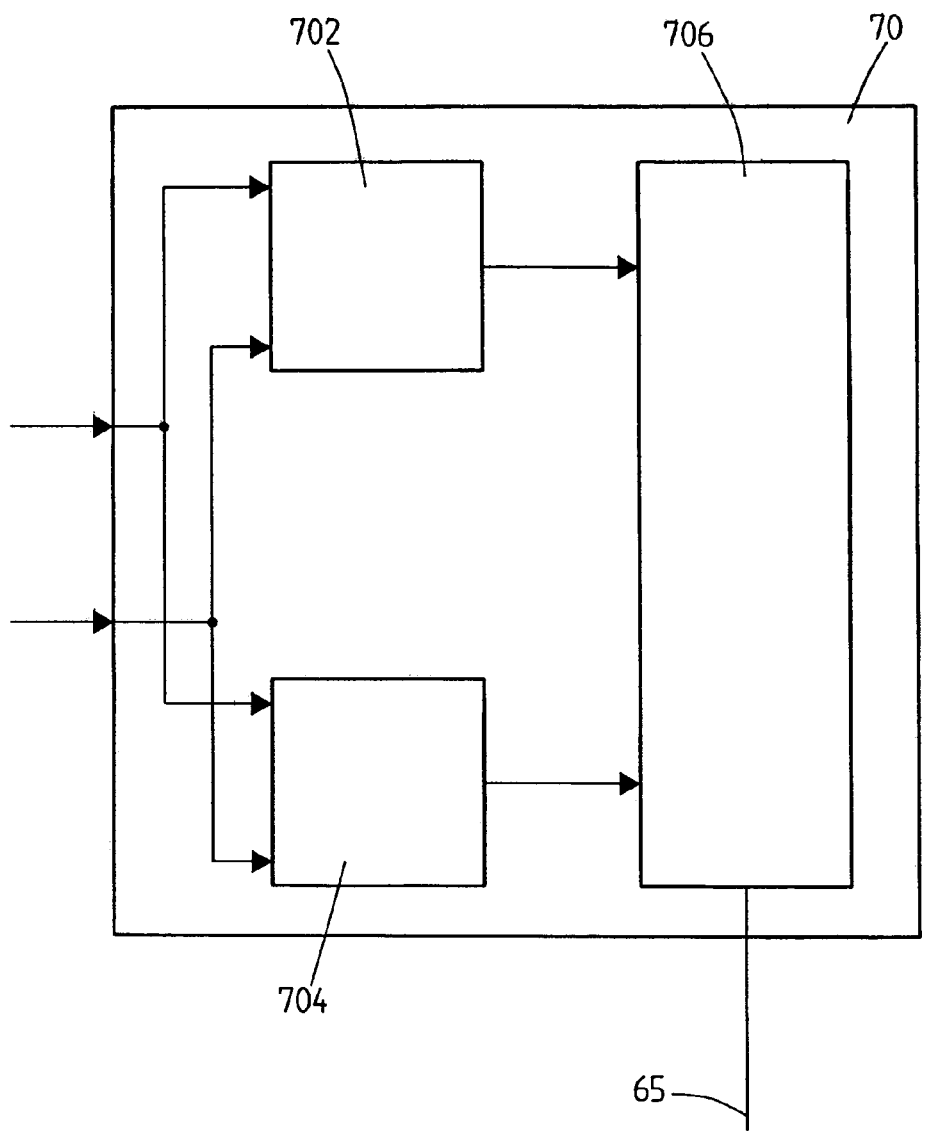
FIG. 13 schematically represents a frequency discriminator module comprised in the receiver of FIG. 12.

According to the invention, the discriminator module 70, now described with reference to the FIG. 13, comprises a frequency discriminator based on the HDFT as described above. More particularly, the discriminator module 70 of the invention extract at least two discrete spectral components of the incoming signal, preferably two spectral components corresponding to two frequencies $f_D$ and $f_U$, symmetrically placed above and under the zero frequency.

Each spectral component is extracted by a frequency extraction means 702 or 704, which have a maximum response for the desired spectral component $f_D$, respectively $f_U$. The response naturally decreases for different frequencies, but in a manner that the response does not go to zero for any intermediate frequency between $f_D$ and $f_U$. In particular the response of the frequency extraction means 702 and 704 do not go to zero at the intermediate point f=0.

Thanks to this feature, the discriminator of the invention can extract a frequency error signal, obtained by the comparison means 706 which are arranged for calculating the difference of the absolute-value outputs of 702 and 704, and preferably for normalizing the difference by dividing it by the sum of the absolute-value outputs of frequency extraction means 702 and 704.

Even if, for the sake of simplicity, this example shows the frequency extraction means 702 and 704 as separate entities, it is to be understood that the present invention may also comprise a single frequency extraction means, which extracts the two required spectral components $f_D$, $f_U$ in turn. In practical embodiments, the frequency extraction means will often consist of a software module, which contains code for calculating the values $H_D$ and $H_U$, when executed by a microprocessor.

By using the HDFT operator described above, the frequencies $f_D$ and $f_U$ are $f_D=-\frac{1}{2}NT$ to $f_U=\frac{1}{2}NT$, that is they are centred on half-integer values with respect to the natural binning of the sequence of the N incoming digital data $\{x_i\}$, which are sampled at a T sampling rate.

In a preferred embodiment, the frequency extraction means 702 and 704 implement the operators $H_D$ and $H_U$ that have the form set out in equation (11) above. However, the operators $H_D$ and $H_U$ may also be obtained, according to the present invention, from different mathematical operators, for extracting a frequency component of the incoming signal, as the circumstances may require.

The frequency discriminator of the invention is based on a variant of the DFT transform in which the usual twiddle factors are replaced with twiddle factors as for a DFT on a number of points which is the double as the actual number of sample points. The DFT so modified allows half-bin frequency discrimination, with few added computational burden. Two DFT shifted of half bin with respect to the zero frequency provide a linear response of the discrimination and good immunity to noise. The discriminator of the invention is particularly useful in FLL for tracking signals in a GPS receiver.

According to the circumstances, the discriminator module 70 may be realized as a dedicated electronic digital circuit, or as a microcontroller device, programmed in a manner as to carry out the steps of the method of the invention. The invention also comprises a software code, which can be loaded in the program memory of a computer device, for executing the steps of set forth above when the program is executed.

The invention claimed is:

1. Method of obtaining a frequency difference between an input signal and a reference frequency, comprising the steps of:
    applying a first operator for extracting a discrete spectral component of the input signal at a lower frequency and a second operator for extracting a discrete spectral component of the input signal at a upper frequency, the upper frequency and the lower frequency being placed above and under the reference frequency, wherein said first operator has a maximum response at said lower frequency and said second operator has a maximum response at said upper frequency;
    calculating the difference of the two spectral component's frequencies for obtaining a error value depending on the distance between the input signal's fundamental frequency and the reference frequency; and
    outputting said error value to an apparatus.

2. Method according to claim 1, further characterized in that: the response of first and second operators does not go to zero for any intermediate frequency comprised between the upper frequency and the lower frequency.

3. Method according to claim 2, characterized in that the upper frequency and the lower frequency are symmetrically placed around the reference frequency.

4. Method according to claim 1, characterized in that the error value is linearly dependent from the distance between the input signal's fundamental frequency and the reference frequency.

5. Method according to claim 1, characterized in that the reference frequency is the zero frequency.

6. Method according to claim 1, characterized in that the two operators comprise a step of calculating an absolute value of the output.

7. Method according to claim 1, comprising a step of dividing the error value by the sum of the two spectral components from the first and second operators.

8. Method according to claim 1, characterized in that the input signal comprises a number of N successive samples, and in that the first and second operators comprise a linear combination of the samples, with weight factors taken from the 2N distinct complex roots of unity of order 2N.

9. Method according to the preceding claim, in which the first and second operators are given by the formula $$H_U(x) = \sum_{i=0}^{N-1} x_i \cdot e^{-j\frac{2\pi \cdot i}{2N}}$$

$$H_D(x) = \sum_{i=0}^{N-1} x_i \cdot e^{j\frac{2\pi \cdot i}{2N}}.$$

10. Computer program for execution on a computer for carrying out the steps of method of claim 1.

11. Discriminator device, comprising:
    an input, for receiving an input signal; and
    frequency discriminator means, for generating an output signal dependent on the difference from the fundamental frequency of the input signal and a reference frequency, wherein
    the frequency discriminator means comprise first extraction means for extracting a discrete signal component of the input signal at a lower frequency and second extraction means for extracting a discrete signal component of the input signal at an upper frequency, the upper frequency and the lower frequency being placed above and under the reference frequency, and wherein
    said first extraction means has a maximum response at said lower frequency and wherein said second extraction means has a maximum response at said upper frequency, such that the response of the frequency discriminator means does not go to zero for any intermediate frequency between said lower frequency and said upper frequency.

12. Discriminator device according to claim 11, wherein the reference frequency is the zero frequency.

13. Frequency control device, comprising a variable frequency source, a mixer for combining an input frequency with an output of the variable frequency source, a discriminator according to claim 11 comparing an output signal of the mixer and generating a frequency error signal, for driving the variable frequency source and locking it to the input frequency.

14. GPS receiver, comprising a frequency control device according to claim 13.

15. GPS receiver, comprising a discriminator according to claim 11.

* * * * *

UNITED STATES PATENT AND TRADEMARK OFFICE
CERTIFICATE OF CORRECTION

PATENT NO.         : 7,528,632 B2
APPLICATION NO.    : 11/343754
DATED              : May 5, 2009
INVENTOR(S)        : Joel Brenner It is certified that error appears in the above-identified patent and that said Letters Patent is hereby corrected as shown below:

In the Specifications:

Column 4, line 62: Please delete the "-" in between the "x," and the "1/2)" so that it reads: HDFT(x,1/2) =

Column 5, line 8: Please delete the word "Ware" and replace with --W are--

Signed and Sealed this

Twenty-eighth Day of July, 2009

JOHN DOLL
*Acting Director of the United States Patent and Trademark Office*